(12) United States Patent
Sung et al.

(10) Patent No.: US 10,134,930 B2
(45) Date of Patent: Nov. 20, 2018

(54) SOLAR CELL HAVING THREE-DIMENSIONAL P-N JUNCTION STRUCTURE AND METHOD FOR MANUFACTURING SAME

(71) Applicant: DAEGU GYEONGBUK INSTITUTE OF SCIENCE AND TECHNOLOGY, Daegu (KR)

(72) Inventors: Shi-Joon Sung, Daegu (KR); Si-Nae Park, Daegu (KR); Dae-Hwan Kim, Daegu (KR); Jin-Kyu Kang, Daegu (KR); Dae-Kue Hwang, Daegu (KR)

(73) Assignee: DAEGU GYEONGBUK INSTITUTE OF SCIENCE AND TECHNOLOGY, Daegu (KR)

( * ) Notice: Subject to any disclaimer, the term of this patent is extended or adjusted under 35 U.S.C. 154(b) by 136 days.

(21) Appl. No.: 15/025,677

(22) PCT Filed: Sep. 24, 2014

(86) PCT No.: PCT/KR2014/008895
§ 371 (c)(1),
(2) Date: Mar. 29, 2016

(87) PCT Pub. No.: WO2015/046876
PCT Pub. Date: Apr. 2, 2015

(65) Prior Publication Data
US 2016/0240709 A1    Aug. 18, 2016

(30) Foreign Application Priority Data

Sep. 30, 2013  (KR) .................... 10-2013-0116215
Jul. 30, 2014  (KR) .................... 10-2014-0097247

(51) Int. Cl.
*H01L 31/044*  (2014.01)
*H01L 31/0352*  (2006.01)
(Continued)

(52) U.S. Cl.
CPC ............ *H01L 31/035281* (2013.01); *H01L 31/022466* (2013.01); *H01L 31/0322* (2013.01);
(Continued)

(58) Field of Classification Search
CPC ........ H01L 31/00–31/078; Y02E 10/50–10/60
(Continued)

(56) References Cited

U.S. PATENT DOCUMENTS 5,501,744 A * 3/1996 Albright ......... H01L 31/022425
136/244
2007/0264488 A1* 11/2007 Lee ....................... H01L 31/032
428/323

(Continued)

FOREIGN PATENT DOCUMENTS

EP    2750200 A2    7/2014
JP    2013544038 A   12/2013
(Continued)

OTHER PUBLICATIONS

Chung, C et al., "Properties of kesterite Cu2ZnSnS4 (CZTS) thin films prepared by sol-gel method using two types of solution," Journal of Ceramic Processing Research, vol. 14 No. 2 (2013), pp. 255-259.
(Continued)

*Primary Examiner* — Bach T Dinh
(74) *Attorney, Agent, or Firm* — Fredrikson & Byron, P.A.

(57) ABSTRACT

The present invention provides a 3-dimensional P-N junction solar cell composed of a base board coated with a back plate on the upper face of the same; a P type semiconductor thin film formed on the top side of the back plate which has a 3-dimensional porous structure and is composed of P type semiconductor crystal grains; a N type buffer layer formed
(Continued)

on the surface of the crystal grains of the said P type semiconductor thin film with playing a role of coating the thin film; and a transparent electrode formed on the surface of the crystal grains of the P type semiconductor thin film on which the N type buffer layer is formed. The solar cell of the present invention is a P-N junction solar cell including a 3-dimensional photo catalytic thin film, which can provide an improved photoelectric conversion efficiency, compared with the conventional P-N junction solar cell, owing to the formation of the N-type buffer layer on the surface of the crystal grains of the 3-dimensional P type semiconductor thin film.

11 Claims, 10 Drawing Sheets

(51) Int. Cl.
| | | |
|---|---|---|
| *H01L 31/072* | (2012.01) | |
| *H01L 31/032* | (2006.01) | |
| *H01L 31/0445* | (2014.01) | |
| *H01L 31/0224* | (2006.01) | |
| *H01L 31/0749* | (2012.01) | |
| *H01L 31/18* | (2006.01) | |

(52) U.S. Cl.
CPC ...... *H01L 31/0326* (2013.01); *H01L 31/0445* (2014.12); *H01L 31/072* (2013.01); *H01L 31/0749* (2013.01); *H01L 31/18* (2013.01); *Y02E 10/50* (2013.01)

(58) Field of Classification Search
USPC .................................................. 136/243–265
See application file for complete search history.

(56) References Cited

U.S. PATENT DOCUMENTS

| | | | | |
|---|---|---|---|---|
| 2011/0024793 | A1* | 2/2011 | Jeon | H01L 31/022425 257/184 |
| 2011/0049481 | A1* | 3/2011 | Xavier | B82Y 10/00 257/40 |
| 2011/0127515 | A1* | 6/2011 | Miyake | C08G 61/123 257/40 |
| 2011/0315201 | A1 | 12/2011 | Lin et al. | |
| 2012/0288988 | A1* | 11/2012 | Inai | H01L 21/02551 438/95 |
| 2014/0170803 | A1* | 6/2014 | Sapirman | H01L 31/18 438/87 |
| 2015/0249214 | A1* | 9/2015 | Watanabe | H01L 51/42 136/263 |

FOREIGN PATENT DOCUMENTS

| | | |
|---|---|---|
| KR | 1020090104304 A | 10/2009 |
| KR | 1020110107673 A | 10/2011 |
| KR | 1020130057915 A | 6/2013 |
| KR | 1020130089350 A | 8/2013 |
| WO | 2011029197 A1 | 3/2011 |

OTHER PUBLICATIONS

English Abstract and Machine Translation (claims) for Japanese Publication No. 2013-544038 A, published Dec. 9, 2013, 6 pgs.
PCT International Search Report (translation) dated Feb. 27, 2015 for Intl. App. No. PCT/KR2014/008895, from which the instant application is based, 3 pgs.

* cited by examiner

[Figure 1]
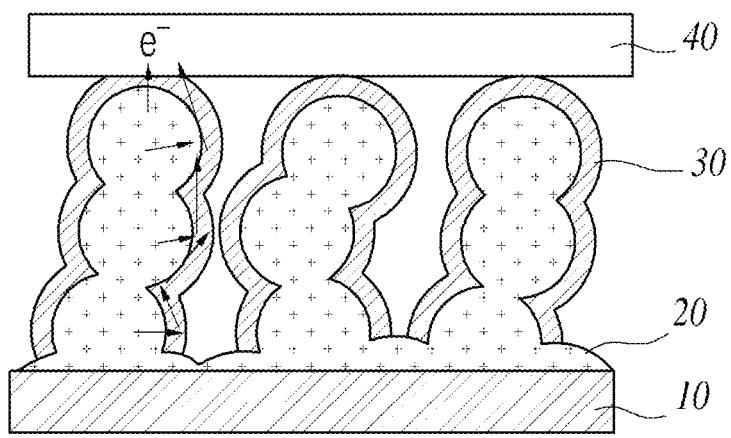
[Figure 2]
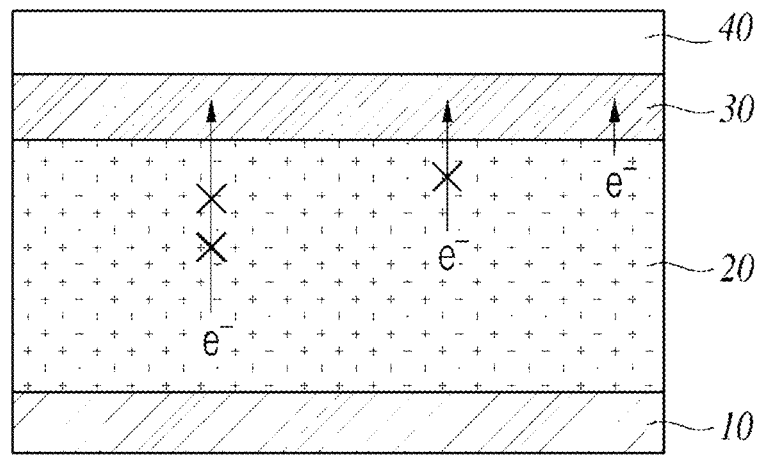

[Figure 3]
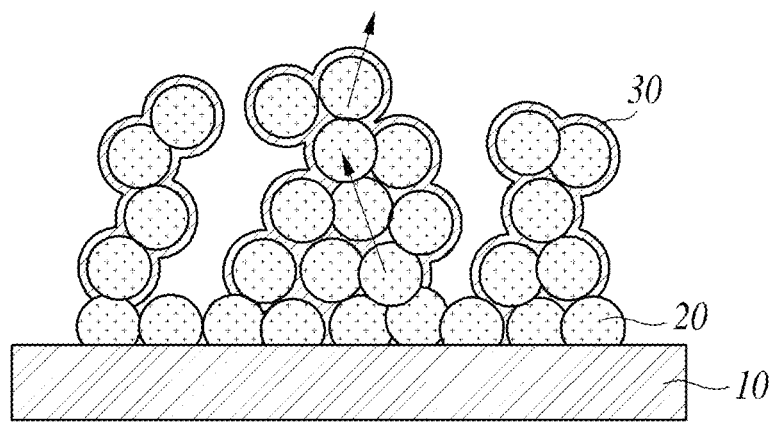
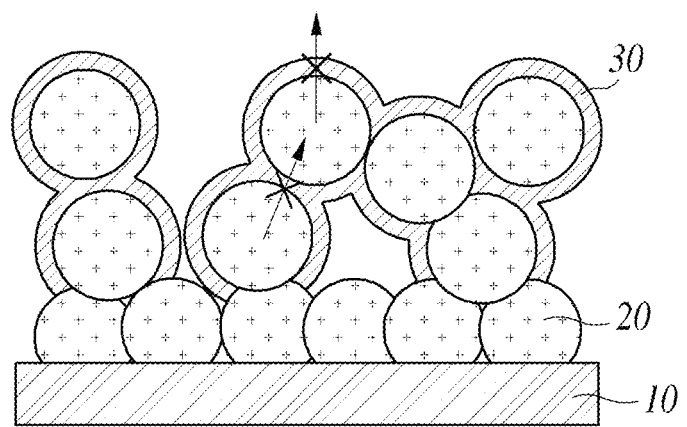

[Figure 4]
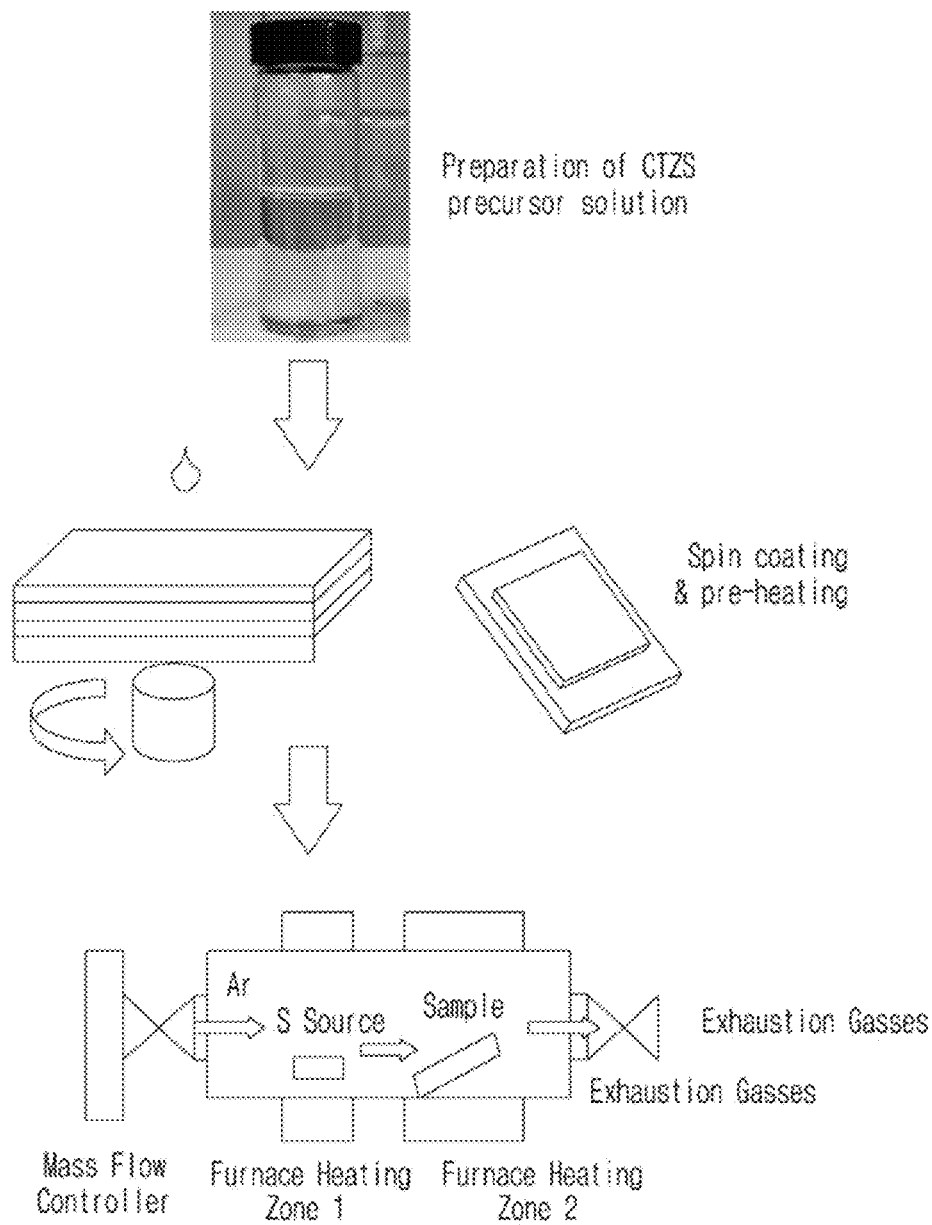

[Figure 5]
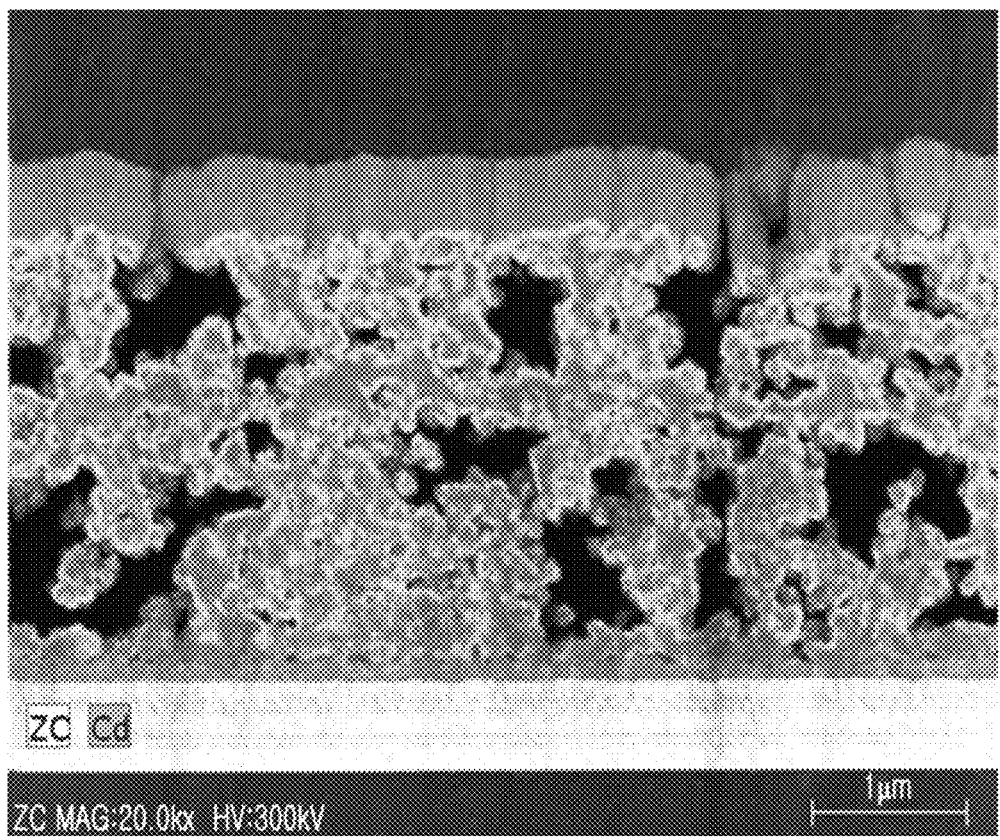

[Figure 6]
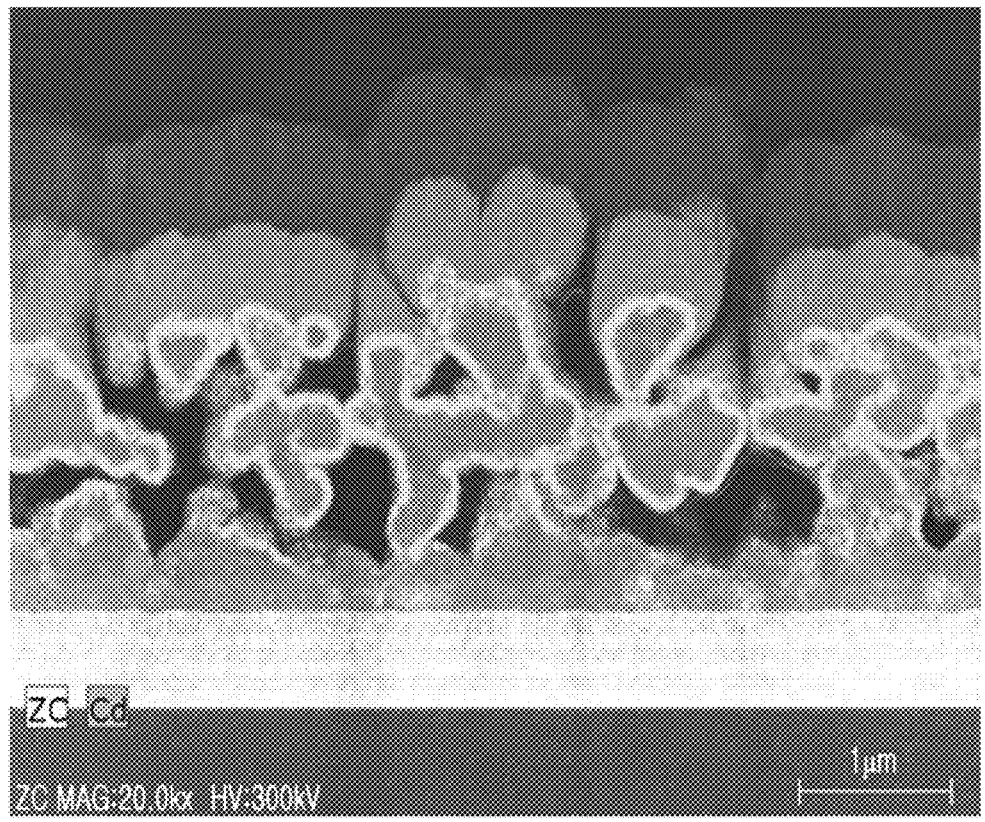

[Figure 7]
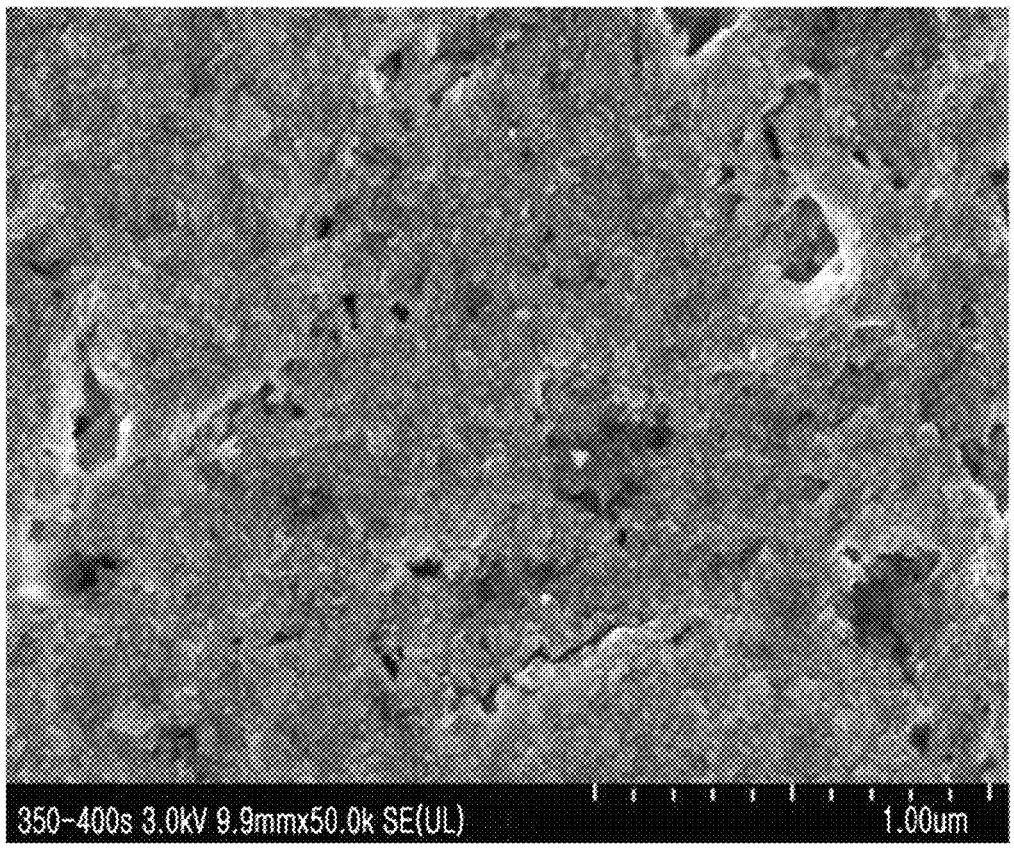

[Figure 8]
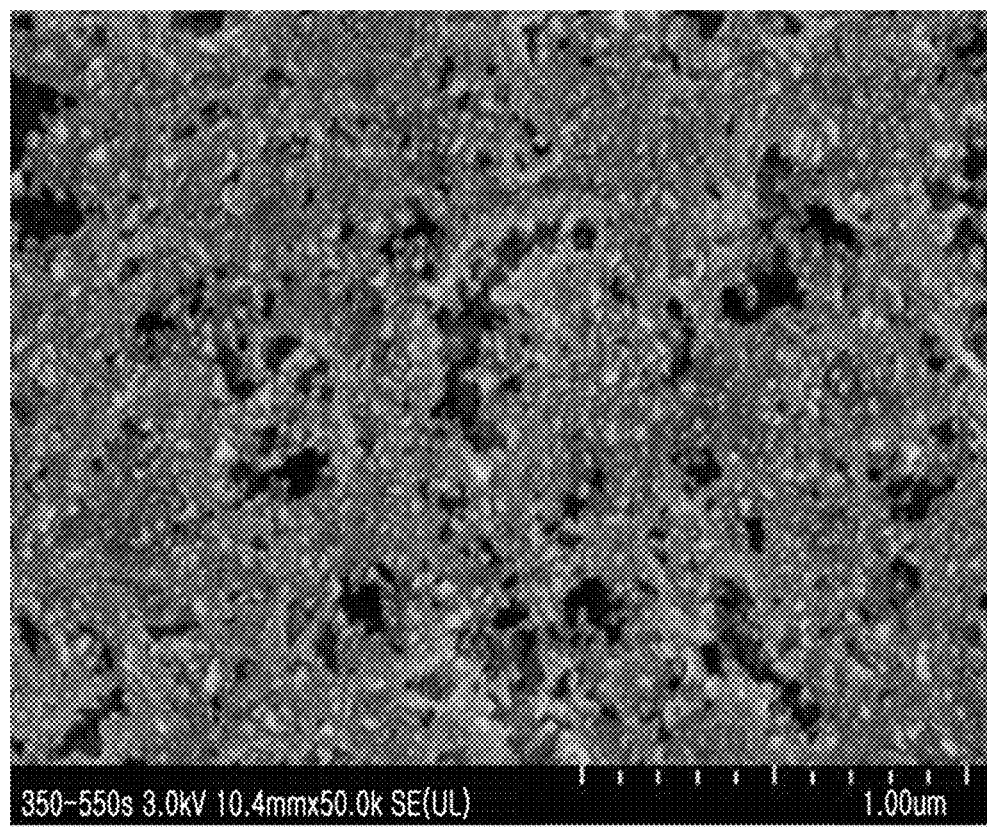

[Figure 9]
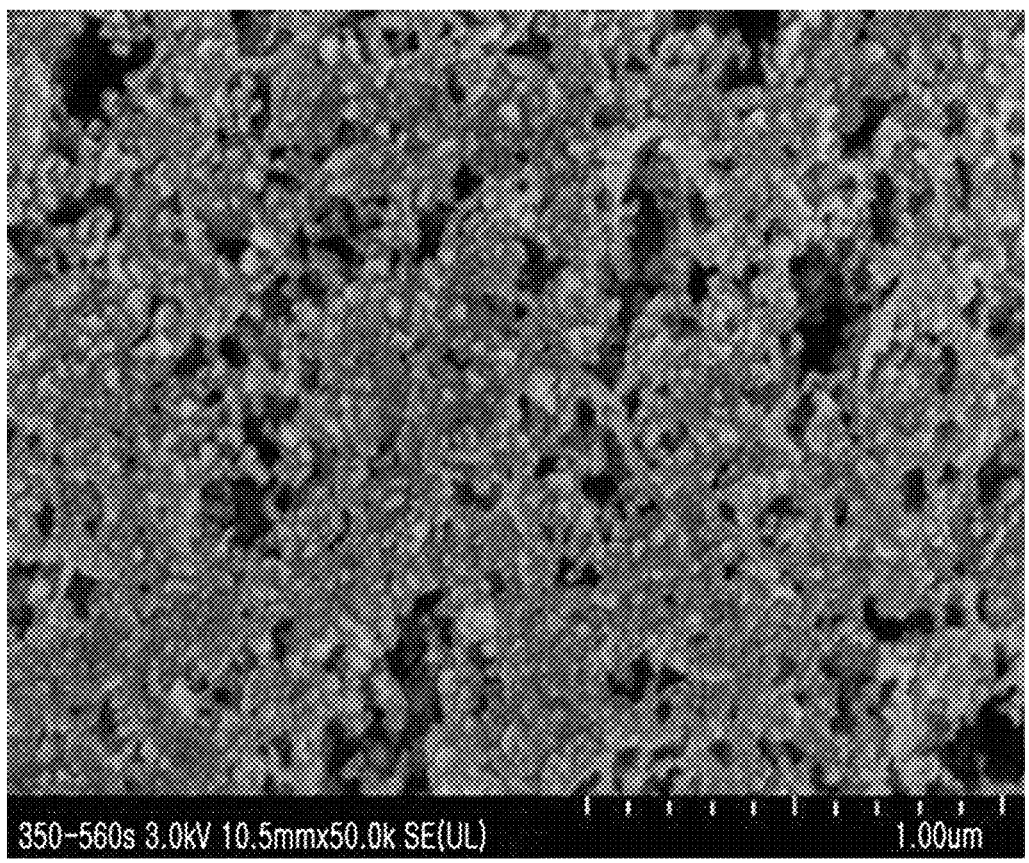

[Figure 10]
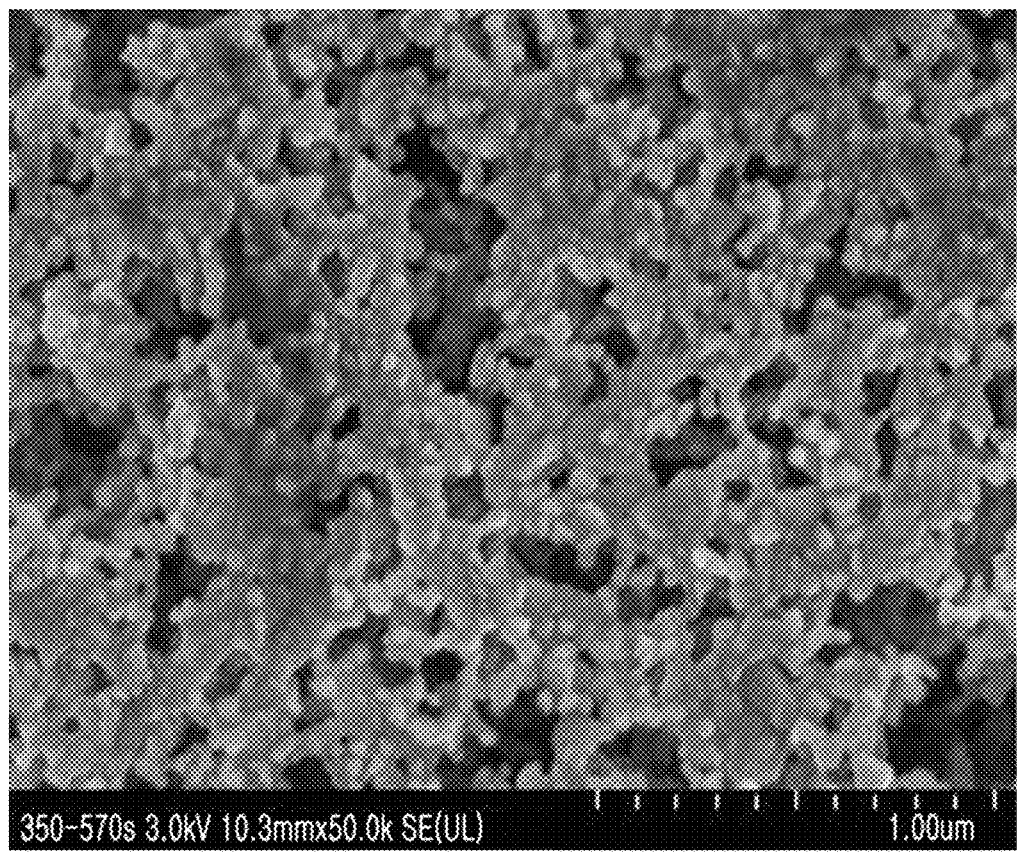

[Figure 11]
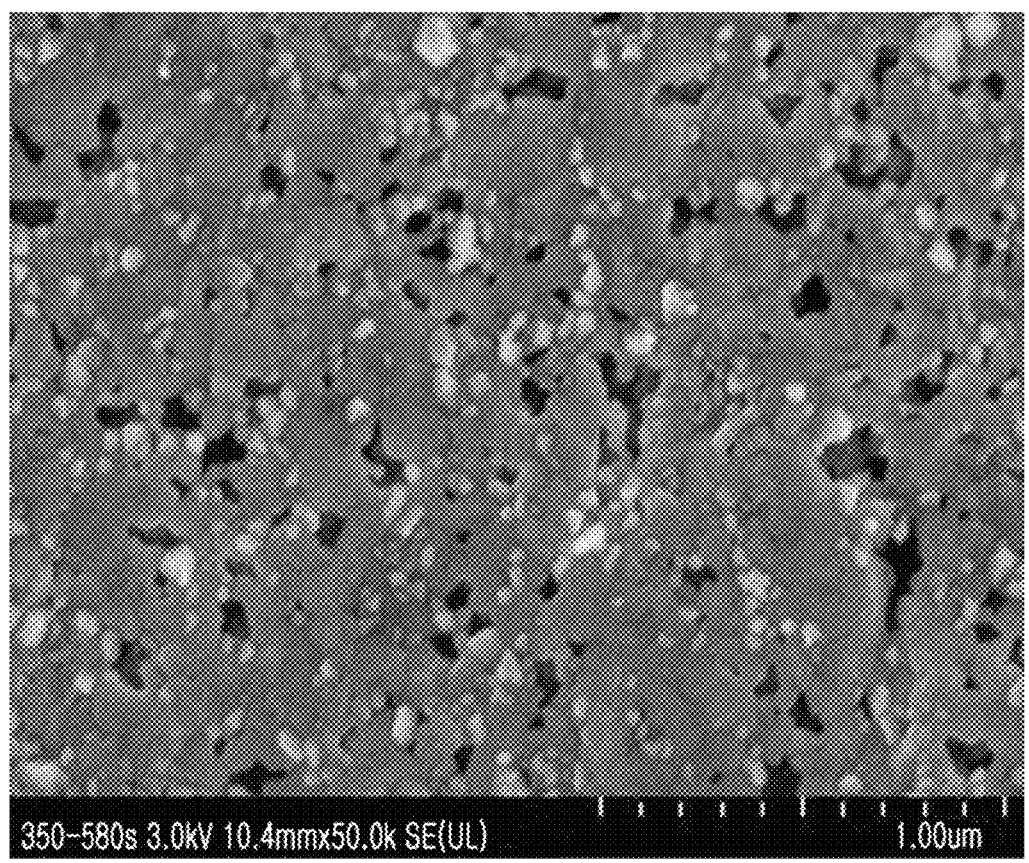

SOLAR CELL HAVING THREE-DIMENSIONAL P-N JUNCTION STRUCTURE AND METHOD FOR MANUFACTURING SAME

RELATED APPLICATIONS

This application is a 35 U.S.C. 371 national stage filing from International Application No. PCT/KR2014/008895, filed Sep. 24, 2014, which claims priority to Korean Application No. 10-2014-0097247, filed Jul. 30, 2014, and to Korean Appliclation No. 10-2013-0116215, filed Sep. 30, 2013, the teachings of which are incorporated herein by reference.

BACKGROUND OF THE INVENTION

1. Field of the Invention

The present invention relates to a 3-dimensional P-N junction solar cell and the preparation method of the same.

2. Description of the Related Art

The solar cell that can generate electricity directly from the sunlight is the most promising future energy production method, considering it is advantageous for producing a clear energy safely. To construct such a solar cell, a variety of inorganic and organic semiconductors have been applied. However, the most representative products succeeded in the commercialization so far are the silicon solar cell comprising silicon (Si) as a major material and the CIGS thin film solar cell.

The said silicon solar cell has the advantage of high photo conversion efficiency but has the disadvantage of high production costs. As an alternative, a thin film solar cell is attracting our interests which uses a compound semiconductor where a thinner layer can be applied. The representative thin film solar cell is such a thin film solar cell that comprises IB elements (CIS or CIGS), IIIA elements, and VIA elements as the light absorption layer.

The major components of the thin film solar cell are the light absorption thin film generally composed of Cu(In,Ga)Se$_2$ and the buffer thin film composed of Cds or other n-type compound semiconductors. In particular, the CIS or CIGS light absorption layer is the most critical factor that affects the performance of such a solar cell.

The CIS or CIGS light absorption layer is generally produced by co-evaporation method or vacuum evaporation method such as sputtering using an expensive vacuum equipment. And recently solution process such as printing has been studied in order to lower the manufacturing costs of the CIS or CIGS thin layer solar cell and also to make the area large.

However, since the highly expensive raw materials such as In and Ga are necessary for the production of CIS or CIGS thin film solar cell, the effort to lower the manufacturing costs with the raw materials is limited.

Instead of In and Ga, the compound $Cu_2ZnSnS_4$ (CZTS) or $Cu_2ZnSnSe_4$ (CZTSe) containing Zn and Sn which are distributed rich on the earth and less hazardous has a highly preferable optical properties appropriate for the solar cell (for example, optical absorption coefficient: $>10^{-4}$ cm, band gap: 1.5 eV), so that it came in to the spotlight as a next generation thin film solar cell material that could replace the CIGS thin film solar cell.

There are two kinds of methods to prepare the CZTS thin film, which are vacuum process and non-vacuum process.

The vacuum process includes sputtering and co-evaporation method. This method has the advantage of easiness in controlling the chemical composition, phase behavior of the thin film, microstructure of the thin film, and reproducibility, but has the disadvantage of high costs.

In the meantime, the non-vacuum process can provide a solar cell with an inexpensive price, which includes spin coating, spraying, and nanoparticle based method.

To perform the non-vacuum process, an organic binder is necessary to secure the coating property, and the resulting carbon residue is a problem. The morphology of the thin film is also limited in this method.

In general, P-N junction solar cell is produced by forming the P-N junction between P type semiconductor and N type semiconductor. Once exposed on a strong light, electrons and positive holes are excited and move freely in the semiconductor, and then the electrons and positive holes move to each electrode by P-N junction to generate electric current.

To produce a high performance solar cell, it is necessary to make the movement of the electrons and positive holes smooth in the semiconductor. To do so, a strategy either to increase the diffusion length of a carrier so as to make the movement of the electrons and positive holes smooth or to deliver a carrier to the electrode more efficiently is necessary. Therefore, the studies concerning a high quality solar cell light absorption layer forming technique have been actively going on.

Korean Patent No 10-1149474 presents the preparation method of a CIS or CZTS compound thin film which is used as the light absorption layer of a solar cell. Precisely, the method for preparing a CIS or CZTS compound thin film via solution process is described therein.

However, it is still required to improve the efficiency of such a CZTS solar cell, compared with other types of solar cells.

In the course of study to establish a solar cell with a simpler preparation process but with a high efficiency, the present inventors succeeded in the preparation of a nano level 3-dimensional P-N junction solar cell wherein a 3-dimensional porous P type semiconductor thin film is formed and the surface of the crystal grains of the P type semiconductor thin film is coated by the N type buffer layer, and further confirmed that this solar cell could be able to not just overcome the limited efficiency but increase the efficiency of the conventional thin film solar cell by making the carrier formed by a light delivered smoothly, leading to the completion of the P-N junction solar cell of the invention.

SUMMARY OF THE INVENTION

It is an object of the present invention to provide a 3-dimensional P-N junction solar cell and a preparation method of the same.

To achieve the above object, the present invention provides a 3-dimensional P-N junction solar cell comprising:

a base board coated with a back plate on the upper face of the same;

a P type semiconductor thin film formed on the top side of the back plate which has a 3-dimensional porous structure and is composed of P type semiconductor crystal grains;

a N type buffer layer formed on the surface of the crystal grains of the said P type semiconductor thin film with playing a role of coating the thin film; and a transparent electrode formed on the surface of the crystal grains of the P type semiconductor thin film on which the N type buffer layer is formed.

The present invention also provides a preparation method of a 3-dimensional P-N junction solar cell comprising the following steps:

forming a 3-dimensional porous P type semiconductor thin film on top of the base board coated with the back plate (step 1);

coating the surface of the crystal grains of the P type semiconductor thin film with the N type buffer layer (step 2); and forming a transparent electrode on the P type semiconductor thin film on which the N type buffer layer is formed in step 2 (step 3).

The present invention also provides a preparation method of a porous CZTS thin film comprising the following steps:

preparing a CZTS precursor solution by mixing one or more precursors selected from the group consisting of a copper precursor, a zinc precursor, a tin precursor, and a sulfur or selenium precursor with a solvent (step 1);

coating the base board with the prepared precursor solution (step 2);

pre-heating the coated thin film at 200~400° C. (step 3); and heating the pre-heated thin film at 500~600° C. in the presence of one or more gases selected from the group consisting of sulfur and selenium (step 4).

The present invention further provides a porous CZTS thin film prepared by the method above.

In addition, the present invention provides a solar cell including the CZTS thin film above as the light absorption layer.

Advantageous Effect

The solar cell of the present invention is the P-N junction solar cell including a 3-dimensional photo catalytic thin film, which displays a more improved photoelectric conversion efficiency than that of the conventional P-N junction solar cell resulted from the N type buffer layer formed on the surface of the crystal grains of the 3-dimensional P type semiconductor thin film.

In regard to its preparation method, it is economical since the method can be accomplished simply by a low priced process such as the solution process.

According to the preparation method of the porous CZTS thin film of the invention, a CZTS precursor is coated, pre-heated, and then heated in the presence of such a gas as sulfur or selenium. Therefore, the CZTS thin film is possibly produced via non-vacuum process without using an organic binder and the time and costs for the production can be decreased. In addition, this preparation process is as simple as easy.

It is easy to regulate the morphology of the thin film, the size of the crystal grain, and the porosity according to the temperature and the treatment hours of pre-heating and post-heating, suggesting that it is possible to control the properties of a solar cell.

BRIEF DESCRIPTION OF THE DRAWINGS

The application of the preferred embodiments of the present invention is best understood with reference to the accompanying drawings, wherein:

FIG. 1 is a schematic diagram illustrating the composition of the 3-dimensional P-N junction solar cell of the present invention;

FIG. 2 is a schematic diagram illustrating the composition of the conventional thin film CZTS solar cell;

FIG. 3 is a schematic diagram illustrating the movement of electrons according to the size of the crystal grains forming the 3-dimensional porous P type semiconductor thin film;

FIG. 4 is a schematic diagram illustrating an example of the preparation method of the porous CZTS thin film of the present invention;

FIG. 5 is a photograph taken by transmission electron microscope (TEM) displaying the section of the CZTS thin film of the solar cell prepared in Example 5 of the present invention;

FIG. 6 is a photograph taken by transmission electron microscope (TEM) displaying the section of the CZTS thin film of the solar cell prepared in Comparative Example 1;

FIG. 7 is a photograph taken by scanning electron microscope (SEM) displaying the CZTS thin film prepared in step 1 of Comparative Example 3;

FIG. 8 is a photograph taken by scanning electron microscope (SEM) displaying the porous CZTS thin film prepared in Manufacturing Example 3;

FIG. 9 is a photograph taken by scanning electron microscope (SEM) displaying the porous CZTS thin film prepared in Manufacturing Example 4;

FIG. 10 is a photograph taken by scanning electron microscope (SEM) displaying the porous CZTS thin film prepared in Manufacturing Example 5;

FIG. 11 is a photograph taken by scanning electron microscope (SEM) displaying the porous CZTS thin film prepared in Manufacturing Example 6.

BRIEF DESCRIPTION OF THE MARK OF DRAWINGS

10: back plate
20: 3-dimensional porous P type semiconductor thin film
30: N type buffer layer
40: transparent electrode

DESCRIPTION OF THE PREFERRED EMBODIMENTS

Hereinafter, the 3-dimensional P-N junction solar cell of the present invention is described in detail.

The present invention provides a 3-dimensional P-N junction solar cell comprising:

a base board coated with a back plate on the upper face of the same;

a P type semiconductor thin film formed on the top side of the back plate which has a 3-dimensional porous structure and is composed of P type semiconductor crystal grains;

a N type buffer layer formed on the surface of the crystal grains of the said P type semiconductor thin film with playing a role of coating the thin film; and a transparent electrode formed on the surface of the crystal grains of the P type semiconductor thin film on which the N type buffer layer is formed.

The schematic diagram illustrating the 3-dimensional P-N junction solar cell of the present invention briefly is presented in FIG. 1.

Hereinafter, the 3-dimensional P-N junction solar cell of the present invention is described in more detail with referring to the schematic diagram of FIG. 1.

The solar cell of the present invention, as shown in the schematic diagram of FIG. 1, is composed of the base board coated with a back plate (10) and the 3-dimensional porous P type semiconductor thin film (20) formed on the back plate (10). The surface of the said 3-dimensional porous P type semiconductor thin film is laminated with an N type buffer layer (30), and the transparent electrode (40) is formed on the top surface of the 3-dimensional porous P type semiconductor thin film laminated with the N type buffer layer.

At this time, as described above, the solar cell of the present invention contains the 3-dimensional porous thin film laminated with the N type buffer layer, so that the solar cell provides an increased photoelectric efficiency by shortening the diffusion length of electrons.

That is, as shown in FIG. 2, the conventional CZTS solar cell is composed of the back plate (10), the CZTS photoactive layer (21), the N type buffer layer (30), and the transparent electrode (40), laminated stepwise. As pointed by the arrow in the schematic diagram of FIG. 2, the electrons formed in the interface of the N type buffer layer

(30) can move easily because the diffusion length toward the transparent electrode is short.

However, the electrons formed in the middle of the CZTS photoactive layer or in the interface of the back plate can not move as easily because the diffusion length toward the transparent electrode is long. In the conventional CZTS solar cell, as shown in FIG. 2, the photoactive layer has a poor quality because it has been prepared by the comparatively less advantageous solution process, resulting in the decrease of the photoelectric conversion efficiency.

In the meantime, the solar cell of the present invention is advantageous, as shown in the schematic diagram of FIG. 1, in providing the improved photoelectric conversion efficiency because of the reduced diffusion length of electrons since it includes the 3-dimensional P type semiconductor thin film on which the N-type buffer layer is formed.

In the solar cell of the present invention, the N type buffer layer contains one of those compounds selected from the group consisting of CdS, $TiO_2$, $ZnO_2$, Zn(O, S), ZnMgO, and CdSe, or is formed by a N type semiconductor material such as a conducting polymer selected from the group consisting of [6,6]-phenyl-C85 butyric acid methyl ester (PCBM), polyacetylene, polythiophene, and polyaniline (PANI). However, the N-type buffer layer component is not limited thereto and any material that displays the N type semiconductor characteristics can be properly selected.

The thickness of the N type buffer layer is preferably 20~150 nm. If the thickness of the N type buffer layer is less than 20 nm, it is hard to be fully functioning as a barrier between the P type semiconductor thin film and the transparent electrode, resulting in the difficulty in inhibiting electron recombination. If the thickness of the N type buffer layer is more than 150 nm, the electron gets a strong resistance in the course of passing the thick buffer layer so that the electron cannot move smoothly.

In the solar cell of the present invention, the 3-dimensional porous P type semiconductor is composed of a compound selected from the group consisting of $CuInS_2$ (CIS), $CuGaS_2$ (CGS), $CuInSe_2$ (CISe), $CuGaSe_2$ (CGSe), $CuAlSe_2$ (CASe), CuInTe2 (CITe), CuGaTe2 (CGTe), Cu(In,Ga)S2 (CIGS), Cu(In,Ga)Se2 (CIGSe), $Cu_2ZnSnS_4$ (CZTS), $Cu_2ZnSnSe_4$ (CZTSe), $Cu_2ZnSn(S,Se)_4$ (CZTSSe), $CuSbS_2$, $AgSbS_2$, and CdTe. The average size of the crystal grains forming the porous P type semiconductor thin film is preferably 30~200 nm.

If the average size of the crystal grains is smaller than 200 nm, which means the surface area of the 3-dimensional porous P type semiconductor thin film increases, then, the interfacial area of the N type buffer layer increases and accordingly the movement of electrons becomes easy.

However, if the average size of the crystal grains is larger than 200 nm, the distance from the porous P type semiconductor thin film to the buffer layer increases, as shown in the schematic diagram of FIG. 3, and accordingly the movement of electrons becomes not easy. If the average size of the crystal grains is smaller than 100 nm, the formation of the porous P type semiconductor thin film itself is difficult.

In the meantime, the present invention provides a 3-dimensional P-N junction solar cell wherein the porous P type semiconductor thin film is formed with 20~80% of porosity.

The present invention also provides a 3-dimensional P-N junction solar cell which characteristically has the surface roughness of 30~150 nm and more preferably 50~100 nm.

To prevent the short circuit or shunt due to the direct contact between the back plate and the P type semiconductor thin film, a blocking layer might be laminated on the top surface of the back plate. The blocking layer can be formed by such a material as $MoO_x$, $NiO_2$, $Cu_2O$, $SnO_x$, $TiO_2$, ZnO, and $Al_2O_3$, and the thickness of the blocking layer is 5~20 nm.

In the 3-dimensional P-N junction solar cell of the present invention, the transparent electrode formed on the top surface of the 3-dimensional porous P type semiconductor thin film laminated with the N type buffer layer can comprise ZnO or indium tin oxide (ITO) and at least a part of the N type buffer layer is supposed to contact the transparent electrode.

The present invention also provides a preparation method of a 3-dimensional P-N junction solar cell comprising the following steps:

forming a 3-dimensional porous P type semiconductor thin film on top of the base board coated with the back plate (step 1);

coating the surface of the crystal grains of the P type semiconductor thin film with the N type buffer layer (step 2); and forming a transparent electrode on the P type semiconductor thin film on which the N type buffer layer is formed in step 2 (step 3).

The preparation method of the 3-dimensional P-N junction solar cell of the present invention is described step by step hereinafter.

In the preparation method of the 3-dimensional P-N junction solar cell, step 1 is to form a 3-dimensional porous P type semiconductor thin film on top of the base board coated with the back plate.

At this time, the P type semiconductor thin film is composed of a compound selected from the group consisting of $CuInS_2$ (CIS), $CuGaS_2$ (CGS), $CuInSe_2$ (CISe), $CuGaSe_2$ (CGSe), $CuAlSe_2$ (CASe), CuInTe2 (CITe), CuGaTe2 (CGTe), Cu(In,Ga)S2 (CIGS), Cu(In,Ga)Se2 (CIGSe), $Cu_2ZnSnS_4$ (CZTS), $Cu_2ZnSnSe_4$ (CZTSe), $Cu_2ZnSn(S,Se)_4$ (CZTSSe), $CuSbS_2$, $AgSbS_2$, and CdTe.

For example, a $Cu_2ZnSnS_4$ (CZTS) P type semiconductor thin film can be prepared by the following process.

In the preparation method of the present invention, the CZTS P type semiconductor thin film is prepared by the following steps:

preparing a CZTS precursor solution by mixing a raw material comprising a copper precursor, a zinc precursor, a tin precursor, and a sulfur or selenium precursor with a solvent (step A);

coating the base board with the prepared precursor solution (step B);

pre-heating the coated thin film at 200~400° C. (step C); and heating the pre-heated thin film at 500~600° C. in the presence of one or more gases selected from the group consisting of sulfur and selenium (step D).

In the preparation method of a CZTS thin film above, only the precursors of copper, zinc, tin, and sulfur or selenium are mixed with a solvent and an organic binder is not added thereto. So, the problem of the carbon residue remaining after the process, as shown in the conventional method, is excluded and the morphology can be easily controlled because there is no organic binder, resulting in the easiness of the regulation of the solar cell efficiency.

In the preparation method above, the copper precursor of step B can be one or more chloride materials selected from the group consisting of CuCl, $CuCl_2$, and $CuCl_2.H_2O$. The zinc precursor herein can be such a chloride material as $ZnCl_2$. The tin precursor herein can be one or more chloride materials selected from the group consisting of $SnCl_2$, $SnCl2.H_2O$ and $SnCl_4$, but the copper precursor, zinc precursor, and the tin precursor are not always limited thereto.

The sulfur precursor of step A can be one or more compounds selected from the group consisting of $CH_4N_2S$, $S(NH_4)_2$, $(NH_4)_2SO_4$, $(CH_3)_2S(C_2H_5)_2S$, $(CH_3)_3SH$, $(CH_3)_2CHCH_2SH$, $CH_3(CH_2)_3SH$, $CH_3CH_2CH(SH)CH_3$, and $CH_3CSNH_2$, and the selenium precursor herein can be one or more compounds selected from the group consisting of $SeC(NH_2)_2$, $(CH_3)_2NC(Se)NH_2$, $SeCl_4$, $(CH_3)_2Se$, $Se(C_2H_5)_2$, $Na_2SeO_3$, and $H_2SeO_3$, but the sulfur precursor and the selenium precursor are not always limited thereto.

In the preparation method above, step B is to coat the back plate on the base board with the precursor solution. That is, in step B, a CZTS thin film can be prepared by the simple process of coating the base board with the CZTS precursor solution.

At this time, the coating in step B can be performed by one of the methods selected from the group consisting of spin coating, dip coating, roll coating, screen coating, spray coating, spin casting, flow coating, screen printing, ink jetting, and drop casting, but not always limited thereto.

In the preparation method above, step C is to pre-heat the CZTS thin film at 200~400° C.

That is, after the coating in step B, the morphology of the thin film, the size of the crystal grains, and the porosity can be regulated by performing pre-heating and post-heating, leading to the preparation of a 3-dimensional CZTS thin film.

In the preparation method above, step D is to heat the thin film pre-heated above at 500~600° C. in the presence of a gas containing sulfur or selenium.

If the pre-heated thin film is heated at the temperature of less than 500° C., the CZTS crystal grains are not growing, resulting in the decrease of the quality and characteristics of the solar electrode product. If the pre-heated thin film is heated at the temperature of higher than 600° C., the base board will be bending because of too high heating temperature.

At this time, the gas containing sulfur or selenium can include H2S, S, H2Se, and Se steam, or a mixture of the inactive gases, but not always limited thereto.

In the preparation method of the present invention, the method above is not the only method to produce the P type semiconductor thin film of step 1 but other proper process can be selected to form a 3-dimensional thin film.

In the preparation method of the 3-dimensional P-N junction solar cell of the present invention, step 2 is to coat the surface of the crystal grains of the P type semiconductor thin film of step 1 with the N type buffer layer.

At this time, the N type buffer layer of step 2 can be formed by chemical bath deposition (CBD) but not limited thereto as long as the coating process is enough to coat the surface of the crystal grains of the P type semiconductor thin film with the N type buffer layer.

In the preparation method of the 3-dimensional P-N junction solar cell of the present invention, step 3 is to form the transparent electrode on the top surface of the P type semiconductor thin film laminated with the N type buffer layer in step 2.

In step 3, a transparent electrode is finally formed on top of the P type semiconductor thin film on which the N type buffer layer is formed, by which the 3-dimensional P-N junction solar cell is completed. At this time, the transparent electrode can be made of a material such as ZnO that can be applied to the conventional transparent electrode.

The present invention also provides a preparation method of a porous CZTS thin film comprising the following steps:

preparing a CZTS precursor solution by mixing one or more precursors selected from the group consisting of a copper precursor, a zinc precursor, a tin precursor, and a sulfur or selenium precursor with a solvent (step 1);

coating the base board with the prepared precursor solution (step 2);

pre-heating the coated thin film at 200~400° C. (step 3); and heating the pre-heated thin film at 500~600° C. in the presence of one or more gases selected from the group consisting of sulfur and selenium (step 4).

An example of the preparation method of the porous CZTS thin film is shown in the schematic diagram of FIG. 4. Hereinafter, the preparation method of the porous CZTS thin film of the present invention is described in more detail step by step.

In the preparation method of the porous CZTS thin film of the invention, step 1 is to prepare the CZTS precursor solution by mixing one or more precursors selected from the group consisting of a copper precursor, a zinc precursor, a tin precursor, and a sulfur or selenium precursor with a solvent.

According to the conventional method to prepare the CZTS thin film, coating is performed by vacuum process. So, in order to secure a successful coating, an organic binder is added to the CZTS precursor solution. When a thin film is produced with such a precursor solution like the conventional one, a carbon residue is remaining, resulting in the decrease of the efficiency of a solar cell and the limited morphology.

In the meantime, according to the preparation method of the CZST thin film of the present invention, only the precursors of a copper, zinc, tin, and sulfur or selenium are mixed with a solvent without the addition of an organic binder, so that there is no worry about the remaining carbon residue. Besides, the performance of the produced solar cell can be controlled easily by regulating the morphology due to the absence of an organic solvent.

In the preparation method of the porous CZTS thin film of the present invention, the copper precursor of step 1 can be one or more chloride materials selected from the group consisting of CuCl, $CuCl_2$, and $CuCl_2.H_2O$. The zinc precursor herein can be such a chloride material as $ZnCl_2$. The tin precursor herein can be one or more chloride materials selected from the group consisting of $SnCl_2$, $SnCl2.H_2O$ and $SnCl_4$, but the copper precursor, zinc precursor, and the tin precursor are not always limited thereto.

The sulfur precursor of step 1 can be one or more compounds selected from the group consisting of $CH_4N_2S$, $S(NH_4)_2$, $(NH_4)_2SO_4$, $(CH_3)_2S(C_2H_5)_2S$, $(CH_3)_3SH$, $(CH_3)_2CHCH_2SH$, $CH_3 (CH_2)_3SH$, $CH_3CH_2CH(SH)CH_3$, and $CH_3CSNH_2$, and the selenium precursor herein can be one or more compounds selected from the group consisting of $SeC(NH_2)_2$, $(CH_3)_2NC(Se)NH_2$, $SeCl_4$, $(CH_3)_2Se$, $Se(C_2H_5)_2$, $Na_2SeO_3$, and $H_2SeO_3$, but the sulfur precursor and the selenium precursor are not always limited thereto.

The solvent of step 1 can be one or more solvents selected from the group consisting of ultrapure water and alcohol solvents, but not always limited thereto.

For an example, as a solvent in step 1, ultrapure water alone can be used or a mixture of ultrapure water and an alcohol solvent can be used.

The alcohol solvent can be one or more alcohols selected from the group consisting of C1~C3 lower alcohols, and preferably ethanol, methanol, or 2-methoxy ethanol, but not always limited thereto.

In the preparation method of the porous CZTS thin film of the present invention, step 2 is to coat the base board with the precursor solution above.

According to the present invention, the porous CZTS thin film can be easily prepared by the simple process of coating the base board with the said CZTS precursor solution, suggesting that a lower priced solar cell can be produced by a simpler process.

At this time, the coating in step 2 can be performed by one of the methods selected from the group consisting of spin coating, dip coating, roll coating, screen coating, spray coating, spin casting, flow coating, screen printing, ink jetting, and drop casting, but not always limited thereto.

In the preparation method of the porous CZTS thin film of the present invention, step 3 is to pre-heat the coated thin film at 200~400° C.

In this invention, the morphology of the thin film, the size of the crystal grains, and the porosity can be controlled by performing pre-heating and post-heating after the coating, suggesting that the properties of a solar cell can be easily controlled by a simple regulation process.

If the coated thin film is heated at the temperature lower than 200° C., the solvent in the CZTS precursor solution will not be evaporated and the impurities such as carbon (C) residue and nitrogen (N) residue are remaining in the thin film. If the coated thin film is heated at the temperature higher than 400° C., the crystallization will be unnecessarily continued.

In the preparation method of the porous CZTS thin film of the present invention, step 4 is to heat the thin film pre-heated above at 500~600° C. in the presence of a gas containing sulfur or selenium.

If the pre-heated thin film is heated at the temperature of less than 500° C., the CZTS crystal grains are not growing, resulting in the decrease of the quality and characteristics of the solar electrode product. If the pre-heated thin film is heated at the temperature of higher than 600° C., the base board will be bending because of too high heating temperature.

At this time, the gas containing sulfur or selenium can include $H_2S$, S, $H_2Se$, and Se steam, or a mixture of the inactive gases, but not always limited thereto.

The present invention further provides a porous CZTS thin film prepared by the method above.

The method to produce the porous CZTS thin film of the present invention is characterized by low priced and simplicity in the process since the porous CZTS thin film can be prepared simply by non-vacuum process. In addition, the morphology can be easily regulated because an organic binder is not added.

According to the method above, the morphology of the thin film, the size of the crystal grains, and the porosity can be controlled by regulating the temperature and hours of the heat treatment.

In addition, the present invention provides a solar cell including the porous CZTS thin film above as the light absorption layer.

The solar cell using the porous CZTS thin film of the present invention as a light absorption layer does not include the expensive In or Ga. Therefore, it can be provided with a lower price than the conventional CIGS thin film.

The solar cell of the present invention is prepared by non-vacuum process, so that the process is simple and the processing time is shorter, suggesting that the mass-production with a lowered price is possible.

In addition, the process does not include an organic binder. Therefore, the morphology of the film, the size of the crystal grains, and the porosity are easily controlled, suggesting that the electric properties of the solar cell can be easily regulated.

Practical and presently preferred embodiments of the present invention are illustrative as shown in the following Examples.

However, it will be appreciated that those skilled in the art, on consideration of this disclosure, may make modifications and improvements within the spirit and scope of the present invention.

MANUFACTURING EXAMPLE 1

A porous CZTS thin film was prepared by the following steps.

Step 1: A CZTS precursor solution was prepared by mixing the copper precursor ($CuCl_2$, 0.9 M), zinc precursor ($ZnCl_2$, 0.7 M), tin precursor (SnCl2, 0.5 M), and sulfur precursor ($CH_4N_2S$ (thiourea), 4 M) with the mixed solvent composed of ultrapure water and ethanol at the ratio of 7:3.

Step 2: The base board (ex: glass, metal foil, plastic board, etc.) having Mo electrode formed thereon was coated with the precursor solution above via spin coating.

Step 3: The coated thin film was pre-heated at 350° C.

Step 4: The pre-heated thin film was heated at 500° C. for 20 minutes in sulfur atmosphere.

MANUFACTURING EXAMPLE 2

A porous CZTS thin film was prepared by the same manner as described in Manufacturing Example 1 except that the sulfurization in step 4 was performed at 530° C.

MANUFACTURING EXAMPLE 3

A porous CZTS thin film was prepared by the same manner as described in Manufacturing Example 1 except that the sulfurization in step 4 was performed at 550° C.

MANUFACTURING EXAMPLE 4

A porous CZTS thin film was prepared by the same manner as described in Manufacturing Example 1 except that the sulfurization in step 4 was performed at 560° C.

MANUFACTURING EXAMPLE 5

A porous CZTS thin film was prepared by the same manner as described in Manufacturing Example 1 except that the sulfurization in step 4 was performed at 570° C.

MANUFACTURING EXAMPLE 6

A porous CZTS thin film was prepared by the same manner as described in Manufacturing Example 1 except that the sulfurization in step 4 was performed at 580° C.

EXAMPLE 1

A 3-dimensional P-N junction solar cell was prepared by the following steps.

Step 1: The CZTS thin film prepared in Manufacturing Example 1 was coated with the CdS N type buffer layer via CBD (Chemical Bath Deposition) wherein the CZTS thin film was reacted in the aqueous solution containing $CdSO_4$, $NH_4$, and $CS(NH_2)_2$ dissolved therein.

Step 2: The transparent electrode ZnO was loaded on the top surface of the CdS N type buffer layer of step 1 by using RF sputter equipment via vacuum deposition, resulting in the preparation of a 3-dimensional P-N junction solar cell.

EXAMPLE 2

A 3-dimensional P-N junction solar cell was prepared by the same manner as described in Example 1 except that the CZTS thin film prepared in Manufacturing Example 2 was coated with the CdS N type buffer layer in step 1.

EXAMPLE 3

A 3-dimensional P-N junction solar cell was prepared by the same manner as described in Example 1 except that the CZTS thin film prepared in Manufacturing Example 3 was coated with the CdS N type buffer layer in step 1.

EXAMPLE 4

A 3-dimensional P-N junction solar cell was prepared by the same manner as described in Example 1 except that the CZTS thin film prepared in Manufacturing Example 4 was coated with the CdS N type buffer layer in step 1.

EXAMPLE 5

A 3-dimensional P-N junction solar cell was prepared by the same manner as described in Example 1 except that the CZTS thin film prepared in Manufacturing Example 5 was coated with the CdS N type buffer layer in step 1.

EXAMPLE 6

A 3-dimensional P-N junction solar cell was prepared by the same manner as described in Example 1 except that the CZTS thin film prepared in Manufacturing Example 6 was coated with the CdS N type buffer layer in step 1.

COMPARATIVE EXAMPLE 1

A P-N junction solar cell was prepared by the following steps.

Step 1: A porous CZTS thin film was prepared by the same manner as described in Manufacturing Example except that the heating was performed at 620° C. in step 4.

Step 2: A P-N junction solar cell was prepared by forming the ZnO transparent electrode and the CdS N type buffer layer on the porous CZTS thin film prepared in step 1.

COMPARATIVE EXAMPLE 2

A P-N junction solar cell was prepared by the same manner as described in Comparative Example 1 except that the heating was performed at 480° C. in step 1.

COMPARATIVE EXAMPLE 3

A P-N junction solar cell was prepared by the same manner as described in Comparative Example 1 except that the heating was performed at 400° C. in step 1.

COMPARATIVE EXAMPLE 4

A P-N junction solar cell was prepared by the same manner as described in Comparative Example 1 except that the heating was performed at 700° C. in step 1.

EXPERIMENTAL EXAMPLE 1

The sections of the CZTS thin films of the solar cells prepared in Example 5 and Comparative Example 1 were observed by transmission electron microscope (TEM/EDX) and the results are shown in FIG. 5 and FIG. 6.

As shown in FIG. 5, the CZTS thin film of Example 5 is composed of the CZTS crystal grains in the average size of approximately 150 nm and the surface of the crystal grain is coated with the CdS buffer layer.

As for the conventional CZTS thin film solar cell, the CdS buffer layer is formed on the surface alone as a thin film. However, in the case of the solar cell of Example 5, not only the thin film but also the surface of all the crystal grains in the CZTS absorption layer are evenly coated by the CdS buffer layer.

As shown in FIG. 6, in the solar cell prepared in Comparative Example 1, the CZTS thin film is composed of the CZTS crystal grains in the average size of approximately 500 nm. As shown in Example 5, the CdS buffer layer was evenly laminated on the surface of all the CZTS crystal grains in Comparative Example 1. However, the size of the crystal grain was bigger than that of Example 5, indicating that the surface area was smaller than that of Example 5, so the thickness of the CdS buffer layer coating the surface was comparatively thick.

As shown in FIG. 5 and FIG. 6, the surface are of CZTS of the solar cell of Example 5 having the crystal grains in the size of 150 nm to form the CZTS thin film was larger than the solar cell of Comparative Example 1.

EXPERIMENTAL EXAMPLE 2

The CZTS thin film prepared in Comparative Example 3 and the porous CZTS thin films prepared in Manufacturing Examples 3~6 were observed with scanning electron microscope (SEM), and the results are shown in FIG. 7, and FIGS. 8~11.

EXPERIMENTAL EXAMPLE 3

To investigate the surface roughness of the P type semiconductor thin film prepared according to the preparation condition of the invention, the surfaces of the CZTS thin films prepared in Manufacturing Example 5, Comparative Example 1, and step 1 of Comparative Example 2 were observed by Atomic Force Microscopy (AFM) and the analyzed results are shown in Table 1.

TABLE 1

| CZTS thin film | Sulfurization temperature (° C.) | Surface roughness (nm) |
| --- | --- | --- |
| Manufacturing Example 5 | 570 | 57.3 |
| Comparative Example 1 | 620 | 161.3 |
| Comparative Example 2 | 480 | 24.1 |

As shown in Table 1, the surface roughness of the CZTS thin film prepared in Manufacturing Example 5 was 57.3 nm, and the surface roughness of the CZTS thin film prepared in Comparative Example 1 was 161.6 nm. In the meantime, the surface roughness of the film prepared in Comparative Example 2 was 24.1 nm.

The porosity of the CZTS thin film can be indirectly confirmed by the surface roughness. So, as shown in the results presented in Table 1, if the surface roughness is more than 150 nm, it can be said that the porosity is excessively high. If the surface roughness is less than 30 nm, the porosity of the CZTS thin film will be comparatively lack.

And the efficiency of a solar cell can be indirectly predicted by the porosity. So, it is expected that the solar cell including the CZTS thin film of Manufacturing Example 5 having the surface roughness of 30~150 nm will display the highest efficiency of all.

EXPERIMENTAL EXAMPLE 4

To evaluate the properties of the P-N junction solar cells prepared in Example 5 and Comparative Examples 1 and 2, the efficiency of those solar cells was measured by using a solar simulator under the condition of AM 1.5 (1 sun, 100 mW/cm$^2$). The results are shown in Table 2.

TABLE 2

|  | Sulfurization temperature (° C.) | Open voltage VOC (V) | Short circuit current density $J_{SC}$ (mA/cm$^2$) | Filling factor FF (%) | Photo-electric conversion efficiency PCE (%) | Series resistance (Ω) | Parallel resistance (Ω) |
|---|---|---|---|---|---|---|---|
| Example 5 | 570 | 0.49 | 17.07 | 52.21 | 4.39 | 16.5 | 1344.3 |
| Comparative Example 1 | 620 | 0.21 | 2.08 | 34.13 | 0.15 | 45.0 | 920.1 |
| Comparative Example 2 | 480 | 0.48 | 1.36 | 27.67 | 0.18 | 1061.5 | 2163.6 |

As shown in Table 2, the solar cell prepared in Example 5 displayed as high photoelectric conversion efficiency (PCE) as 4.39%.

Since the size of the crystal grains forming the CZTS thin film of Example 5 was as satisfactorily small as 30~200 nm, the carrier was easily delivered due to the short diffusion length from the CZTS photoactive layer to the buffer layer, resulting in the high short circuit current density (Jsc). Therefore, the photoelectric efficiency of the solar cell was more increased.

In the meantime, as shown in Table 2, the solar cells prepared in Comparative Examples 1 and 2 displayed a low photoelectric conversion efficiency, which were respectively 0.15% and 0.18%. This was because the size of the crystal grains forming the CZTS thin film was bigger than 500 nm. That is, if the size of the crystal grain is bigger, the diffusion length from the photoactive layer to the buffer layer becomes longer. So, the carrier formed by the light can be easily extinct by recombination in the course of transportation, meaning the smooth delivery of the carrier would be difficult and accordingly the short circuit current density (Jsc) is decreased with lowering the efficiency.

That is, if the size of the crystal grains forming the CZTS thin film is big, the photoelectric efficiency of the solar cell cannot be improved, as confirmed in the analysis above.

EXPERIMENTAL EXAMPLE 5

To evaluate the properties of the solar cells prepared in Examples 1~6 and Comparative Examples 3 and 4, the efficiency of those solar cells was measured by using a solar simulator under the condition of AM 1.5 (1 sun, 100 mW/cm$^2$). The results are shown in Table 3.

TABLE 3

|  | Sulfurization temperature (° C.) | Open voltage VOC (V) | Short circuit current density $J_{SC}$ (mA/cm$^2$) | Filling factor FF (%) | Photo-electric conversion efficiency PCE (%) | Series resistance (Ω) | Parallel resistance (Ω) |
|---|---|---|---|---|---|---|---|
| Example 1 | 500 | 0.31 | 8.57 | 33.21 | 0.88 | 145 | 1846.2 |
| Example 2 | 530 | 0.35 | 9.36 | 35.12 | 1.15 | 111 | 1762.4 |
| Example 3 | 550 | 0.42 | 13.35 | 54.34 | 3.08 | 8.5 | 1278.4 |
| Example 4 | 560 | 0.48 | 15.58 | 55.97 | 4.21 | 11.7 | 1824.1 |
| Example 5 | 570 | 0.49 | 17.07 | 52.21 | 4.39 | 16.5 | 1344.3 |
| Example 6 | 580 | 0.54 | 14.83 | 48.03 | 4.67 | 31.6 | 1067.6 |
| Comparative Example 3 | 400 | 0.19 | 2.50 | 39.46 | 0.19 | 7.3 | 969.2 |
| Comparative Example 4 | 700 | — | — | — | — | — | — |

As shown in Table 3, in the solar cell of Comparative Example 3 treated with sulfurization at 400° C., the crystal grains did not grow with showing as low efficiency as 0.19%. On the other hand, in the solar cell of Comparative Example 4 treated with sulfurization at 700° C., the base board was bended and therefore the production of the porous CZTS thin film and the solar cell was impossible.

As shown in Table 3 and FIGS. 8~11, in the solar cells of Examples 3~6 treated with sulfurization at 550~580° C., the crystal grains grew well with displaying as high photoelectric conversion efficiency as 3~4%.

The solar cells of Examples 1 and 2 treated with sulfurization at 500 and 530° C. displayed the photoelectric conversion efficiency of approximately 1%, which was lower than those of the solar cells of Examples 3~6.

As explained hereinbefore, according to the present invention, a porous CZTS thin film can be produced without an organic binder via non-vacuum process and at this time if the film is heated at 550~580° C., the best photoelectric conversion efficiency can be expected. Also, the morphology, the size of the crystal grains, and porosity can be regulated by controlling the heating temperature.

Those skilled in the art will appreciate that the conceptions and specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the invention as set forth in the appended Claims.

What is claimed is:

1. A 3-dimensional P-N junction solar cell comprising:
   a back plate;
   a P type semiconductor thin film formed on a top side of the back plate, the P type semiconductor thin film is composed of $Cu_2ZnSnS_4$(CZTS) having a 3-dimensional porous structure and is composed of P type semiconductor crystal grains;
   an N type buffer layer coated on a surface of the P type semiconductor crystal grains; and a transparent electrode formed on the surface of the P type semiconductor crystal grains on which the N type buffer layer is coated, wherein an average size of the P type semiconductor crystal grains is between about 100 nanometers and about 200 nanometers.

2. The 3-dimensional P-N junction solar cell according to claim 1, wherein the N type buffer layer contains one of those compounds selected from the group consisting of CdS, $TiO_2$, $ZnO_2$, Zn (O,S), ZnMgO, and CdSe.

3. The 3-dimensional P-N junction solar cell according to claim 1, wherein the N type buffer layer contains a conducting polymer selected from the group consisting of [6,6]-phenyl-C85 butyric acid methyl ester (PCBM), polyaniline (PANI), polyacetylene, and polythiophene.

4. The 3-dimensional P-N junction solar cell according to claim 1, wherein the thickness of the N type buffer layer is 20~150 nm.

5. The 3-dimensional P-N junction solar cell according to claim 1, wherein the solar cell additionally contains a blocking layer between the back plate and the P type semiconductor thin film.

6. The 3-dimensional P-N junction solar cell according to claim 1, wherein the P type semiconductor thin film has a porosity of 20~80%.

7. The 3-dimensional P-N junction solar cell according to claim 1, wherein a surface roughness of the P type semiconductor thin film is 50~100 nm.

8. The 3-dimensional P-N junction solar cell according to claim 5, wherein the blocking layer contains a compound selected from the group consisting of $MoO_x$, $NiO_2$, $Cu_2O$, $SnO_x$, $TiO_2$, ZnO, and $Al_2O_3$.

9. The 3-dimensional P-N junction solar cell according to claim 5, wherein the thickness of the blocking layer is 5~20 nm.

10. The 3-dimensional P-N junction solar cell according to claim 1, wherein the transparent electrode comprises a compound selected from the group consisting of ZnO, indium tin oxide (ITO), and $SnO_2$.

11. The 3-dimensional P-N junction solar cell according to claim 1, wherein at least a part of the N type buffer layer contacts the transparent electrode.

* * * * *